United States Patent
Shintani et al.

(10) Patent No.: US 7,259,949 B2
(45) Date of Patent: Aug. 21, 2007

(54) METHOD AND SYSTEM FOR ESD PROTECTION OF BALANCED CIRCUIT BOARD LINES

(75) Inventors: Peter Shintani, San Diego, CA (US); Yoshihisa Tahara, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 226 days.

(21) Appl. No.: 10/953,840

(22) Filed: Sep. 29, 2004

(65) Prior Publication Data

US 2006/0067023 A1  Mar. 30, 2006

(51) Int. Cl.
- *H02H 3/20* (2006.01)
- *H02H 9/04* (2006.01)
- *H02H 9/00* (2006.01)
- *H02H 3/22* (2006.01)

(52) U.S. Cl. .................. 361/91.1; 361/56; 361/111
(58) Field of Classification Search ............... 361/91.1, 361/56, 111
See application file for complete search history.

(56) References Cited

U.S. PATENT DOCUMENTS

| | | |
|---|---|---|
| 5,029,041 A | 7/1991 | Robinson |
| 5,164,880 A | 11/1992 | Cronin |
| 5,442,146 A | 8/1995 | Bell et al. |
| 5,708,552 A | 1/1998 | Han et al. |
| 6,183,304 B1 * | 2/2001 | Hollander et al. ...... 439/620.05 |
| 6,407,895 B1 * | 6/2002 | Capps .......................... 361/56 |
| 6,493,198 B1 | 12/2002 | Arledge |
| 6,560,097 B2 * | 5/2003 | Naruo et al. ................. 361/685 |
| 6,776,658 B2 * | 8/2004 | Tang ........................... 439/607 |
| 6,933,837 B2 * | 8/2005 | Gunderson et al. ......... 340/436 |
| 7,190,188 B2 * | 3/2007 | Otsuka et al. ................ 326/30 |
| 2004/0165368 A1 | 8/2004 | Norte |

OTHER PUBLICATIONS

Semtech Product Description for RClamp0504M, 10 pgs., downloaded from www.semtech.com on Sep. 22, 2004.
Web page with product specifications for RClamp0504M, 1 pg., downloaded from www.semtech.com on Sep. 22, 2004.
Web page press release regarding RClamp0504M, 2 pgs., downloaded from www.semtech.com on Sep. 22, 2004.

* cited by examiner

*Primary Examiner*—Stephen W. Jackson
*Assistant Examiner*—Dharti H Patel
(74) *Attorney, Agent, or Firm*—John L. Rogitz

(57) ABSTRACT

An array of electrostatic discharge (ESD) devices conforms to the pitch defined by balanced signal lines on a printed wiring board (PWB) so that the array does not unduly affect the design impedance of the balanced lines.

17 Claims, 3 Drawing Sheets

METHOD AND SYSTEM FOR ESD PROTECTION OF BALANCED CIRCUIT BOARD LINES

I. FIELD OF THE INVENTION

The present invention relates generally to providing electrostatic discharge (ESD) protection for printed wiring boards (PWB) that have balanced lines.

II. BACKGROUND OF THE INVENTION

Printed circuit boards, referred to herein as printed wiring boards (PWB), can contain so-called high speed balanced differential lines, over which "balanced" signals are carried. In such a system, the two lines of a pair of balanced lines must be oriented, sized, and spaced apart from each other such that the characteristic impedance of the total system is at a design impedance. Any deviations from the ideal configuration can deleteriously affect the characteristic impedance of the transmission lines, reducing system performance. Such PWBs may be used in a wide range of applications, including televisions.

Balanced line PWBs, like other PWBs, may require protection from electrostatic surges as might occur when a person touches a TV. Advantageously such PWBs can be provided with electrostatic discharge (ESD) devices. ESD devices typically are electrically connected between individual PWB lines and ground using so-called "traces", to shunt the energy of an electrical surge to ground. As critically recognized herein, in the case of a PWB that does not have pairs of balanced lines, each line is independent of other lines, and as a consequence it is relatively easy to place an ESD protection device between a line and ground.

In contrast, as recognized by the present invention, in the case of a PWB employing balanced differential line pairs, it can be difficult at best to connect an ESD device between each balanced line and ground without undesirably crossing the traces or without requiring the use of so-called "vias" (through holes to other layers of the PWB). Likewise, on the other (ground) side of the ESD device, electrical connection to ground can be complicated and may also require vias. Furthermore, traces can be seen electrically as a "stub" on the balanced transmission line, which could undesirably affect the impedance of the balanced line, and so the length of any such traces between a line and an ESD device should be kept as short as possible. Thus, the challenge addressed herein is to provide ESD devices in a PWB that has balanced line pairs within the layout constraints of a balanced line PWB.

SUMMARY OF THE INVENTION

A printed wiring board (PWB) includes at least one pair of balanced signal lines that define a pitch, and an array of electrostatic discharge (ESD) devices electrically connects each of the balanced signal lines to ground, with the array conforming to the pitch.

In non-limiting embodiments the lateral distance between successive ESD devices in the array, and successive ESD device traces, equals the pitch. If desired, the pair of balanced signal lines can include first and second lines and the array can include first and second ESD devices respectively connected to the first and second lines. A ground may be defined by the PWB, and the first and second ESD devices can be disposed on physically opposite sides of the ground from each other.

In non-limiting examples of how the invention can be used, two pair of balanced signal lines can be provided for carrying universal serial bus (USB) signals and IEEE-1394 signals. Or, three pair of balanced signal lines can be provided for carrying IEEE-1394 signals and associated power line signals. Further, four pair of balanced signal lines can be provided for carrying Digital Visual Interface (DVI) signals and High Definition Multimedia Interface (HDMI) signals. Yet again, four pair of balanced signal lines can be provided for carrying DVI or HDMI signals and two additional single-ended lines can be provided for associated display data channel (DDC) signals.

In some implementations, a connector on the PWB can define the pitch. The array may include one and only one connection to ground that is established by a lead on an end of the array or by a grounding pad on a surface of the array.

In another aspect, an electrostatic discharge (ESD) device apparatus for a printed wiring board (PWB) having at least one pair of balanced signal lines includes plural ESD devices, one for each line in a pair of related balanced signal lines sought to be protected. The apparatus also includes plural traces, with each trace respectively connecting an ESD device to a balanced signal line. The balanced signal lines define a pitch and the traces define a pitch which is substantially equal to the pitch defined by the balanced signal lines.

In yet another aspect, a system includes a printed wiring board (PWB) and balanced signal line means on the PWB for carrying balanced signals. The system also includes electrostatic discharge means operatively engaged with the balanced signal line means for shunting electrostatic surges to ground substantially without altering a design impedance of the balanced signal line means.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
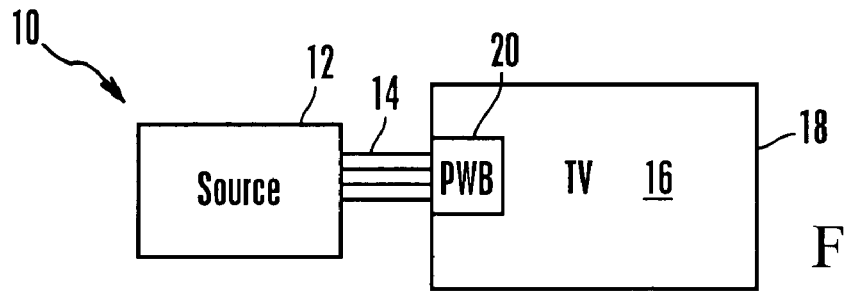
FIG. 1 is a block diagram showing the present PWB in one non-limiting environment.

Referring initially to FIG. 1, by way of illustration only of one non-limiting application of the present PWB with balanced lines and ESD device protection, a system is shown, generally designated 10, which includes a source 12 of audio-video data such as but not limited to high definition (HD) digital video with audio. The source 12 may be a laptop computer or other multimedia computer or server, or it can be a satellite, broadcast, or cable receiver, or it can be a DVD player or other multimedia source, such as a set-top box.

The data may be sent in multiplexed form over lines 14 to a TV or other media receiver 16 having a chassis 18 using, e.g., Digital Visual Interface (DVI) or High Definition Multimedia Interface (HDMI). While four lines 14 are shown, two, six, eight, or more can be used as set forth further below. In any case, the TV 16 can include one or more PWB 20 that are configured in accordance with principles set forth below.

Figure 2:
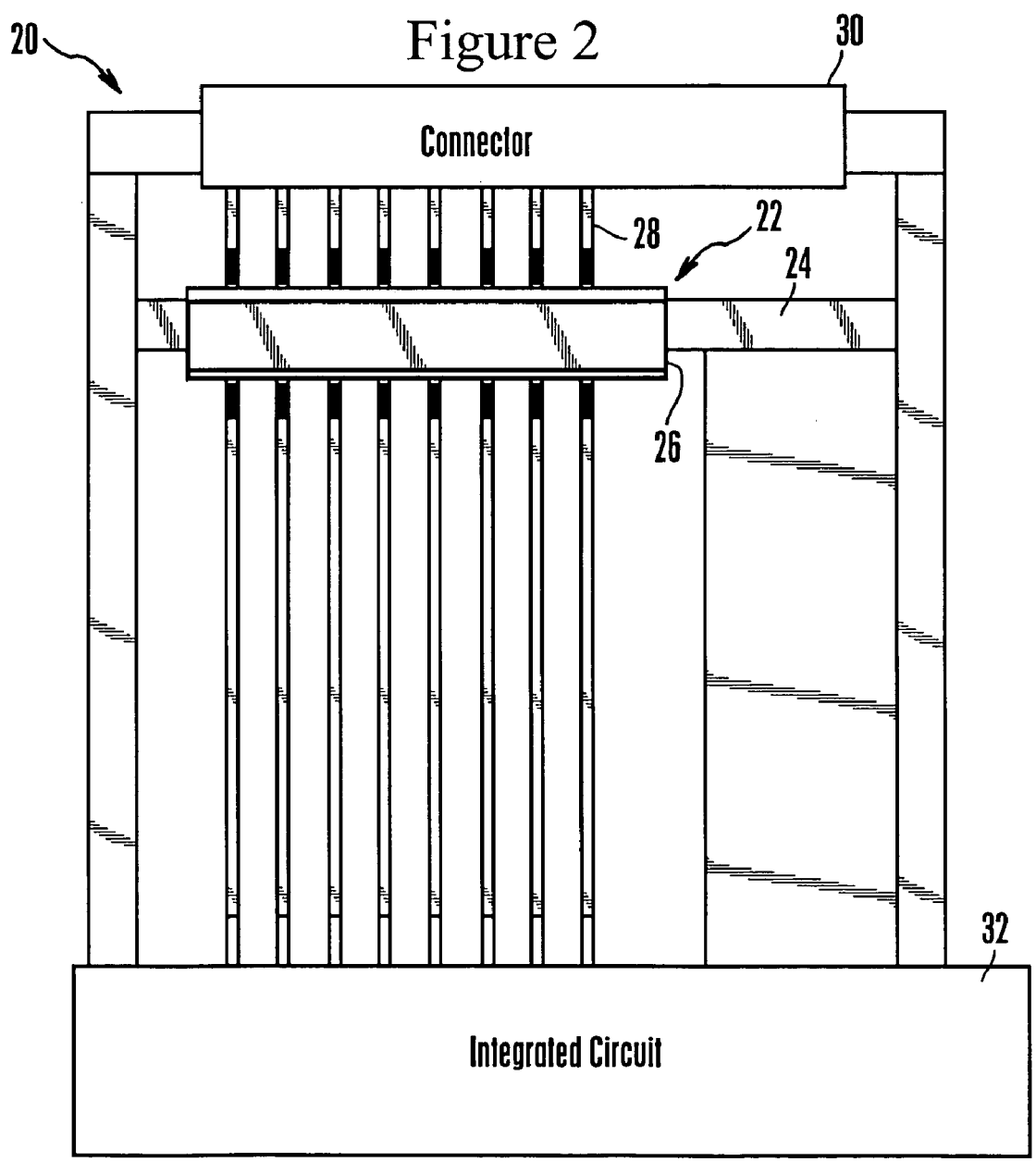
FIG. 2 is a plan view of a PWB in accordance with present principles, showing an ESD device array interposed in balanced pairs of lines near a connector for an integrated circuit on the PWB.

FIG. 2 shows that in one embodiment of the PWB 20, a single array 22 of ESD devices (with the array defining a single housing) can be disposed on a ground strip 24 of the PWB 20. In the non-limiting embodiment shown, a grounding pad 26 is on the bottom surface of the array 22 and the pad 26 contacts the ground strip 24, it being understood that each of the ESD devices in the array 24 and set forth further below is connected to the pad 26. Alternatively, each of the ESD devices in the array 24 and set forth further below may be connected to a single electrical lead on either end of the array 24, with the single lead being connected to ground.

In any case, in the exemplary embodiment shown in FIG. 2 the array 24 is physically engaged with at least one pair (in FIG. 2, four pair are shown) of balanced signal lines 28 that can electrically connect a connector 30 of the PWB 20 to an integrated circuit 32 of the PWB 20. Regardless of the number of balanced signal line pairs, the array 24 matches the pin out of the connector 30 or other interface that must be protected, i.e., the array 24 includes a respective ESD device for each balanced signal line 28, with the pitch defined by the lines 28 (or equivalently, by the connector 30) dictating the pitch between adjacent ESD devices and/or traces in the array 24 as more fully disclosed below. Thus, in the four pair, eight line example shown in FIG. 2, the array 24 has eight ESD devices. By matching the pitches, placement of the protection devices in the path of the signals is facilitated.

Figure 3:
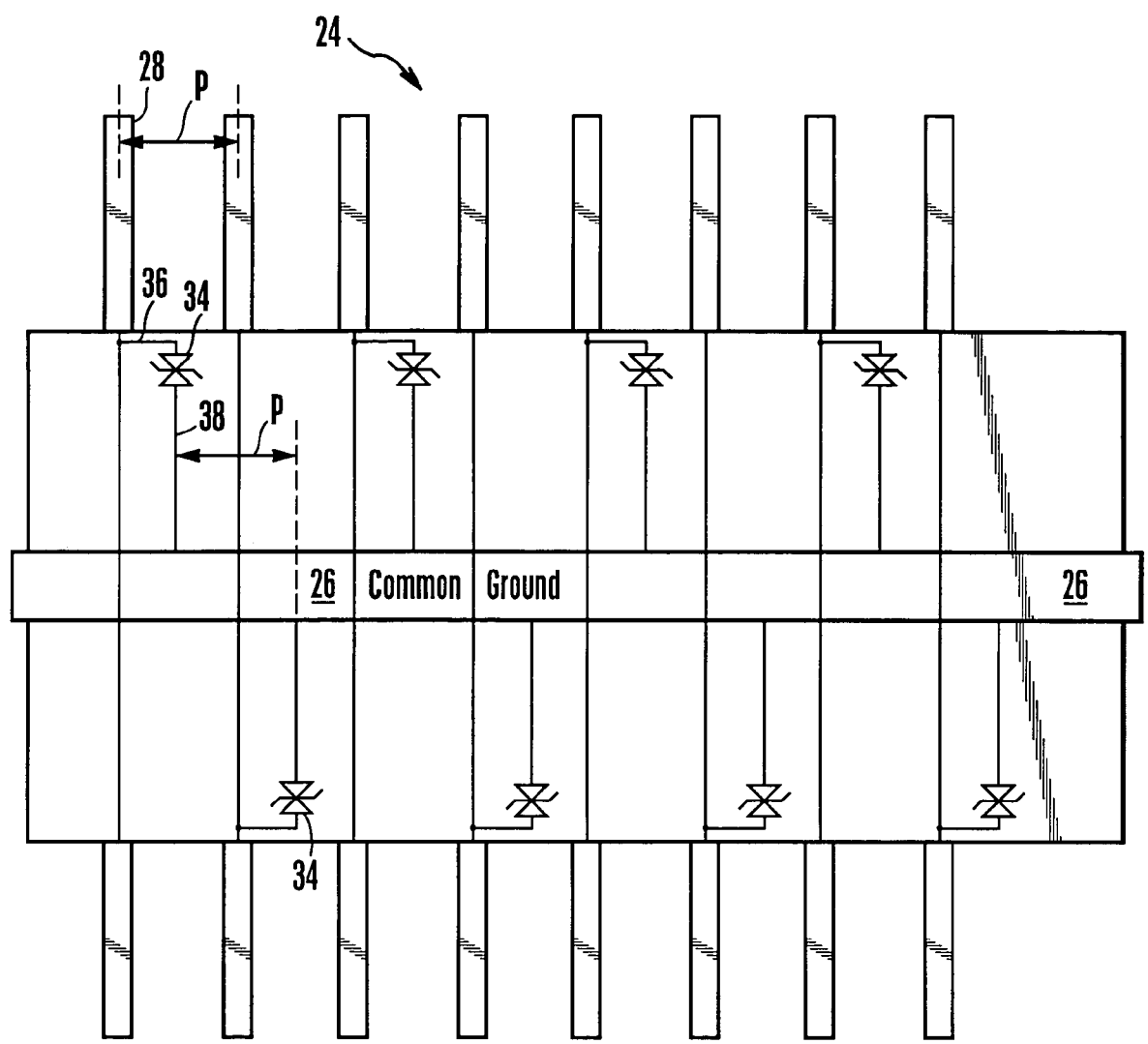
FIG. 3 is a plan view of the PWB shown in FIG. 2, showing the locations of the individual ESD devices.

FIG. 3 shows details of the array 24. As shown, the array 24 has a respective ESD device 34 for each one of the balanced signal lines 28. Any suitable ESD device known in the art may be used, e.g., ESD devices made by California Micro Devices of Milpitas, Calif. or the ESD devices disclosed in U.S. Pat. No. 4,837,657 incorporated herein by reference. These are examples only of ESD devices. In any case, taking the left two balanced signal lines 28 shown in FIG. 3, which establish a first balanced pair, the lateral distance "P" between the centers of adjacent signal lines 28 establishes a pitch. In accordance with principles set forth above, the same lateral distance or pitch "P" can exist between the ESD devices 34 of a balanced pair. Also, as shown in FIG. 3, if desired the ESD devices 34 that are associated with a balanced pair may be disposed on opposite sides of the ground 26 from each other.

Each ESD device 34 is connected to its respective signal line 28 by a respective line trace 36 and to the ground 26 by a respective ground trace 38. The pitch between the centers of line traces 36 and/or centers of ground traces 38 that are associated with the two ESD devices 34 of a balanced pair may also equal the pitch "P" defined by the signal lines 28 (and, hence, the pitch that is also usually defined by the pin out of the connector 30). Regardless of whether the pitch between adjacent ESD devices 34 of a balanced pair equals the pitch "P" defined by the signal lines 28, or whether in lieu of this or in addition to this the pitch between the centers of successive line traces 36 and/or the pitch between successive ground traces 38 also equal the pitch "P", the array 24 conforms to the pitch "P" defined by the balanced signal line pairs.

While FIGS. 2 and 3 illustrate a surface mounted array 24, the principles advanced herein also apply to through-hole parts. In either case, the pitch of the array, and/or the width of the traces 36, 38, and/or the cross sectional area of the traces 36, 38 may be established as appropriate to maintain the impedance of the balanced signal lines 28 as close as possible to the design impedance, i.e., the impedance the PWB lines 28 are intended to have without the ESD device array 24 being imposed thereon. For example, the traces 36, 38 can be made the same width as a typical PWB trace that is designed for one hundred Ohms on a typical PWB substrate, the pitch of the traces of the ESD array 24 can be made the same as that of the balanced lines 28 of the PWB 20 as set forth above, and the thickness of the traces can be minimized so that the characteristic impedance at the junction of a trace and the PWB is minimized.

Figure 4:
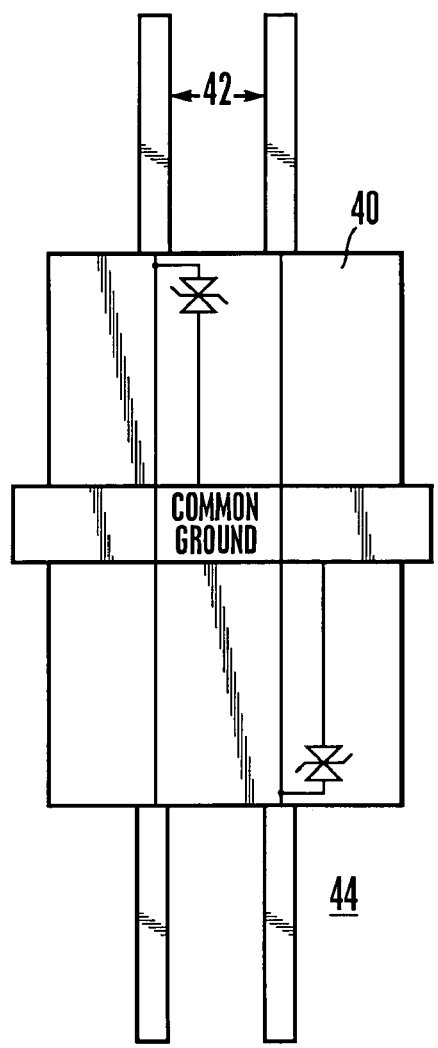
FIG. 4 is a plan view of a PWB having only one pair of balanced lines, showing the locations of the individual ESD devices.
Figure 5:
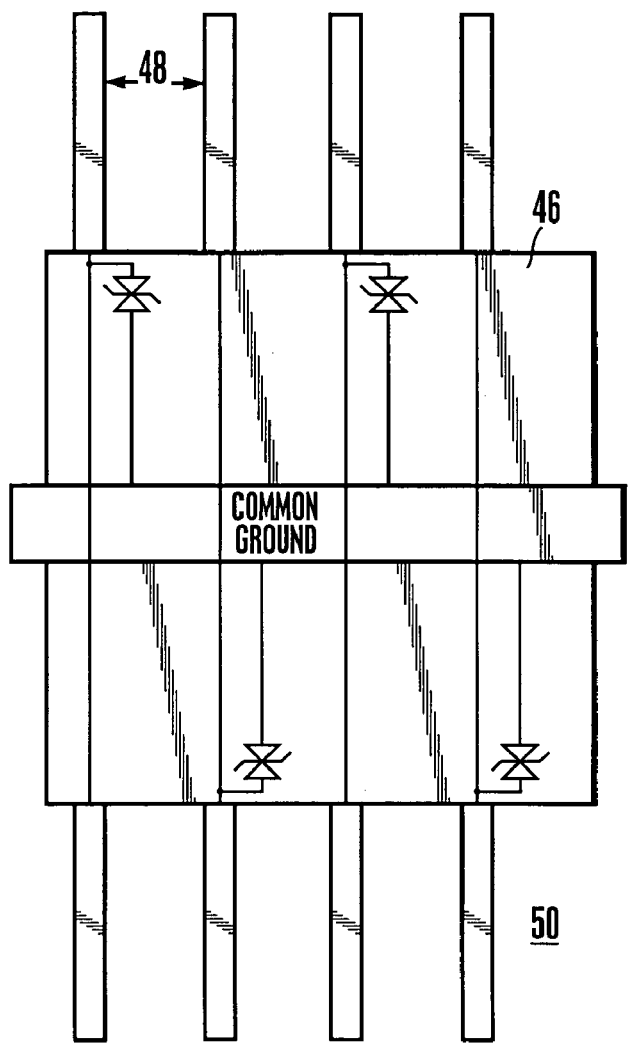
FIG. 5 is a plan view of a PWB having two pair of balanced lines, showing the locations of the individual ESD devices.

As shown in FIGS. 2 and 3, four pair of balanced signal lines 28 can be provided. This might be appropriate for Digital Visual Interface (DVI) signal applications or High Definition Multimedia Interface (HDMI) signal applications. On the other hand, FIG. 4 shows an ESD device array 40 holding two ESD devices imposed on a single pair 42 of balanced signal lines on a PWB 44, while FIG. 5 shows an ESD device array 46 holding four ESD devices and imposed on two pair 48 of balanced signal lines on a PWB 50. The embodiment shown in FIG. 5 may be appropriate for carrying universal serial bus (USB) signals, and for carrying IEEE-1394 signals. Three pair of lines (with an ESD array holding six ESD devices) can be provided for carrying IEEE-1394 signals and associated power line signals, while five pair of lines (four pair balanced, plus two single-ended lines for DDC) might be appropriate for carrying DVI or HDMI signals and associated display data channel (DDC) signals. In a dual link DVI or HDMI, seven pair of balanced lines can be provided in accordance with principles set forth above.

While the particular METHOD AND SYSTEM FOR ESD PROTECTION OF BALANCED CIRCUIT BOARD LINES as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". It is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for" or, in the case of a method claim, the element is recited as a "step" instead of an "act". Absent express definitions herein, claim terms are to be given all ordinary and accustomed meanings that are not irreconcilable with the present specification and file history.

We claim:

1. A printed wiring board (PWB), comprising:
   at least one pair of balanced signal lines defining a pitch; and
   at least one array of electrostatic discharge (ESD) devices electrically connecting each of the balanced signal lines to ground, the array conforming to the pitch, wherein the lateral distance between at least one of: successive ESD devices in the array, or successive ESD device traces, equals the pitch.

2. The PWB of claim 1, wherein the pair of balanced signal lines includes first and second lines and the array includes first and second ESD devices respectively connected to the first and second lines, a ground being defined by the PWB, the first and second ESD devices being disposed on opposite sides of the ground from each other.

3. The PWB of claim 1, comprising two pair of balanced signal lines carrying at least one of: universal serial bus (USB) signals, or signals conforming to IEEE-1394 standard.

4. The PWB of claim 1, comprising three pair of balanced signal lines carrying signals conforming to IEEE-1394 standards and associated power line signals.

5. The PWB of claim 1, comprising four pair of balanced signal lines carrying at least one of: Digital Visual interface (DVI) signals, or High Definition Multimedia Interface (HDMI) signals.

6. The PWB of claim 1, comprising four pair of balanced signal lines carrying DVI or HDMI signals and two lines carrying associated display data channel (DDC) signals.

7. The PWB of claim 1, comprising at least one connector on the PWB and defining the pitch.

8. The PWB of claim 1, wherein the array includes one and only one connection to ground established by at least one of: a lead on an end of the array, or a grounding pad on a surface of the array.

9. An electrostatic discharge (ESD) device apparatus for a printed wiring board (PWB) having at least one pair of balanced signal lines, comprising:
   plural ESD devices, one for each line in a pair of related balanced signal lines sought to be protected; and
   plural traces, each trace respectively connected an ESD device, the balanced signal lines defining a pitch and the traces defining a pitch substantially equal to the pitch defined by the balanced signal lines.

10. The ESD device apparatus of claim 9, wherein the balanced signal lines are associated with a design impedance, and at least the width of each trace is established such that the PWB with ESD device apparatus conforms to the design impedance.

11. The ESD device apparatus of claim 9, wherein the balanced signal lines are associated with a design impedance, and at least the cross-sectional area of each trace is established such that the PWB with ESD device apparatus conforms to the design impedance.

12. The ESD device apparatus of claim 9, wherein the pair of balanced signal lines includes first and second lines and the apparatus includes first and second ESD devices respectively connected to the first and second lines, a ground being defined by the PWB, the first and second ESD devices being disposed on opposite sides of the ground from each other.

13. The ESD device apparatus of claim 9, comprising two pair of balanced signal lines carrying at least one of: universal serial bus (USB) signals, or signals conforming to IEEE-1394 standard.

14. The ESD device apparatus of claim 9, comprising three pair of balanced signal lines carrying signals conforming to IEEE-1394 standard and associated power line signals.

15. The ESD device apparatus of claim 9, comprising four pair of balanced signal lines carrying at least one of: Digital Visual Interface (DVI) signals, or High Definition Multimedia Interface (HDMI) signals.

16. The ESD device apparatus of claim 9, comprising four pair of balanced signal lines carrying DVI or HDMI signals and two lines carrying associated display data channel (DDC) signals.

17. The ESD device apparatus of claim 9, wherein the apparatus includes one and only one connection to ground established by at least one of: a lead on an end of an array of ESD devices, or a grounding pad on a surface of an array of ESD devices.

* * * * *